United States Patent
Ogitsu

(10) Patent No.: US 10,026,633 B2
(45) Date of Patent: Jul. 17, 2018

(54) WAFER BOAT AND MANUFACTURING METHOD OF THE SAME

(71) Applicant: CoorsTek KK, Tokyo (JP)

(72) Inventor: Takeshi Ogitsu, Yamagata (JP)

(73) Assignee: COORSTEK KK, Shinagawa-Ku, Tokyo (JP)

( * ) Notice: Subject to any disclaimer, the term of this patent is extended or adjusted under 35 U.S.C. 154(b) by 230 days.

(21) Appl. No.: 15/183,004

(22) Filed: Jun. 15, 2016

(65) Prior Publication Data
US 2016/0379859 A1 Dec. 29, 2016

(30) Foreign Application Priority Data

Jun. 29, 2015 (JP) ................................. 2015-129432

(51) Int. Cl.
| | |
|---|---|
| *B32B 3/02* | (2006.01) |
| *H01L 21/673* | (2006.01) |
| *C23C 16/32* | (2006.01) |
| *C23C 16/44* | (2006.01) |
| *C23C 16/458* | (2006.01) |
| *B24C 1/06* | (2006.01) |

(52) U.S. Cl.
CPC .......... *H01L 21/67306* (2013.01); *B24C 1/06* (2013.01); *C23C 16/325* (2013.01); *C23C 16/4404* (2013.01); *C23C 16/4581* (2013.01)

(58) Field of Classification Search
CPC ..... Y10T 428/24182; Y10T 428/24355; H01L 21/67306; B24C 1/06
See application file for complete search history.

(56) References Cited

FOREIGN PATENT DOCUMENTS

| | | |
|---|---|---|
| JP | S62-142758 A | 6/1987 |
| JP | H10-330971 A | 12/1998 |
| JP | 2000-164522 A | 6/2000 |
| JP | 2008-277781 A | 11/2008 |
| JP | 2008-311254 A | 12/2008 |
| JP | 2010-10304 A | 1/2010 |

OTHER PUBLICATIONS

Notification of Reasons for Refusal issued by the Japanese Patent Office in corresponding Japanese Patent Application No. 2015-129432 dated Mar. 16, 2018 (4 pages including partial English translation).

*Primary Examiner* — Alexander Thomas
(74) *Attorney, Agent, or Firm* — Buchanan, Ingersoll & Rooney PC

(57) ABSTRACT

A wafer boat supporting a silicon wafer to be processed provides a sufficient anchor effect between a deposit film and a SiC coating film formed on a base material, and suppresses generation of particles due to peeling off of the deposit film. The vertical wafer boat includes a plurality of columns, being made of SiC-based material having a SiC coating film on a surface thereof, which contains shelf plate portions for supporting wafers, and a top plate and a bottom plate for fixing upper and lower ends of the columns, wherein a supporting plane which is in contact with an outer peripheral portion of the wafer is provided on an upper surface of the shelf plate portion, and a surface roughness Ra of a lower surface of the shelf plate increases toward a front side of the shelf plate portion from a rear side.

8 Claims, 6 Drawing Sheets

WAFER BOAT AND MANUFACTURING METHOD OF THE SAME

BACKGROUND OF THE INVENTION

Field of the Invention

The present invention relates to a wafer boat and a manufacturing method for the same, and relates to a wafer boat which holds a silicon wafer in a vertical low-pressure CVD apparatus used in a manufacturing process for a semiconductor device, for example, and a manufacturing method for such a wafer boat.

Description of the Related Art

A CVD apparatus is employed for forming a film by chemical vapor deposition on a surface of a silicon wafer to be processed. FIG. 4 illustrates a conventional vertical low-pressure CVD apparatus 30. The CVD apparatus 30 includes a furnace main body 31, a process tube 32, accommodated in the furnace main body 31, in which a plurality of silicon wafers W can be loaded, and a heater (not shown) disposed between the furnace main body 31 and the process tube 32. The process tube 32 is made of high-purity quartz or silicon carbide (SiC), and can maintain a high-temperature state by being heated on the inside. The process tube 32 is connected to a vacuum pump (not shown), to reduce an internal pressure less than or equal to a predetermined pressure (for example, 1.3 kPa).

A central part of a base 33 to be covered with the process tube 32 is provided with a boat receiver 34 on which a vertical rack type wafer boat 1 is disposed. The wafer boat 1 holds the plurality of silicon wafers W with a predetermined spacing in the vertical direction. On one side of the wafer boat 1 are provided a gas inlet tube 35 and a thermocouple protection tube 36. The gas inlet tube 35 introduces reaction gas into the furnace. The thermocouple protection tube 36 incorporates a thermocouple for measuring the temperature in the furnace.

In such a vertical low-pressure CVD apparatus 30, the plurality of silicon wafers W is held on the wafer boat 1 and housed in the furnace main body 31.

Next, after the pressure of the furnace is reduced to a predetermined pressure of 1.3 kPa or less, for example, and the temperature in the furnace is raised to a temperature between 600° C. and 900° C., for example, a polycrystalline silicon film and a silicon nitride film, for example, are formed on the silicon wafer surface by introducing a reactive gas (material gas), such as $SiH_4$, with a carrier gas such as hydrogen gas $H_2$ into the furnace through the inlet tube 35.

The conventional wafer boat 1 is disclosed in, for example, JP 2008-277781 A. The wafer boat 1 disclosed in JP 2008-277781 A includes, as illustrated in FIG. 5, a pair of a top plate 3 and a bottom plate 4 on the upper and lower sides, each plate having a larger outer diameter than the silicon wafer W to be held, and a plurality of (three in FIG. 5) columns 2 connecting between the plates. The top plate 3 and the bottom plate 4 are formed to have a disc-shape similar to the silicon wafer W.

As illustrated in FIG. 6, the column 2 is provided with support grooves 2a for supporting the silicon wafers W, which forms shelf plate portions 2b projecting from the side surface of the column. The upper surface of the shelf plate portion 2b serves as a supporting plane 2b1. That is to say, the silicon wafer W is held by placing an outer peripheral portion of the silicon wafer W on each supporting plane 2b1 of the column 2.

The wafer boat 1 is made of SiC-based material with a surface thereof provided with a SiC coating film formed by CVD processing. The SiC coating film suppresses diffusion of impurities from the inside of the base material to the outside.

Incidentally, when the wafers W in the wafer boat 1 are subjected to CVD processing, a processed film (hereinafter referred to as a deposit film) is deposited not just on the wafers W but also on the wafer boat 1 that holds the wafers W.

The CVD processing may produce a difference in thermal expansion coefficient between the deposit film (such as SiN or Si) and the SiC coating film formed on the surface of the base material of the wafer boat 1. This difference results in the lack of adhesion strength of the deposit film attached on the SiC coating film (an anchor effect), which may cause adhesion to the silicon wafer W of the deposit film as particles which is peeled off from the SiC coating film, when loading wafers W on the shelf plate portion 2b.

SUMMARY OF THE INVENTION

The present invention has been made in view of such circumstances, and an object thereof is to provide a wafer boat which supports the silicon wafer to be processed, which provides the sufficient anchor effect between the deposit film and the SiC coating film formed on the base material, and which can suppress the generation of particles due to the peeling off of the deposit film, and a manufacturing method for such a wafer boat.

A vertical wafer boat according to the present invention made for solving the problem includes a plurality of columns, being made of SiC-based material with a surface thereof provided with a SiC coating film, which includes shelf plate portions for supporting wafers placed thereon, and a top plate and a bottom plate for fixing upper and lower ends of the columns, wherein a supporting plane which is in contact with an outer peripheral portion of the wafer is provided on an upper surface of the shelf plate portion, and a surface roughness Ra of a lower surface of the shelf plate increases toward a front side of the shelf plate portion from a rear side.

It is desirable that the surface roughness Ra of the lower surface of the shelf plate portion is 1.0 μm or more and 3.0 μm or less. It is also desirable that the top plate and the bottom plate are made of the SiC-based material similar to the column, and that a SiC coating film is formed on the surface of the base material.

In this structure, the lower surface of the shelf plate portion is subjected to a roughing process. Thus, when heat treatment is performed with the wafers held in this manner, the amount of deposit (the accumulative thickness of the deposit film) on the lower surface increases and therefore the peeling off of the deposit film is suppressed. As a result, generation of particles can be reduced drastically and the adhesion of the particles on the wafer can be suppressed.

When the lower surface of the shelf plate portion is roughened more toward the front side, the deposit film is deposited more easily on the front side of the shelf plate portion where the separation of the deposit film would easily occur, and the peeling off of the deposit film can be suppressed.

Further, a manufacturing method for a vertical wafer boat according to the present invention made for solving the problem includes a plurality of columns, which are made of SiC-based material with a surface thereof provided with a SiC coating film and include shelf plate portions for having wafers placed thereon, and a top plate and a bottom plate for fixing upper and lower ends of the columns, and the method includes a step of performing a process so that a lower surface of the shelf plate portion has a surface roughness Ra increasing from a rear side to a front side of the shelf plate portion.

It is desirable that, in the step of performing a roughening process to the lower surface of the shelf plate portion, the roughening process is performed so that the surface roughness Ra is in a range of 1.0 μm or more and 3.0 μm or less. It is desirable that the method further includes a step of performing a smoothing process to an upper surface of the shelf plate portion.

With this manufacturing method, the aforementioned wafer boat can be obtained.

According to the present invention, the wafer boat which supports the silicon wafer to be processed, which provides the sufficient anchor effect between the deposit film and the SiC coating film formed on the base material, and which can suppress the generation of particles due to the peeling off of the deposit film, and a manufacturing method for such a wafer boat can be provided.

DESCRIPTION OF THE PREFERRED EMBODIMENTS

Figure 5:
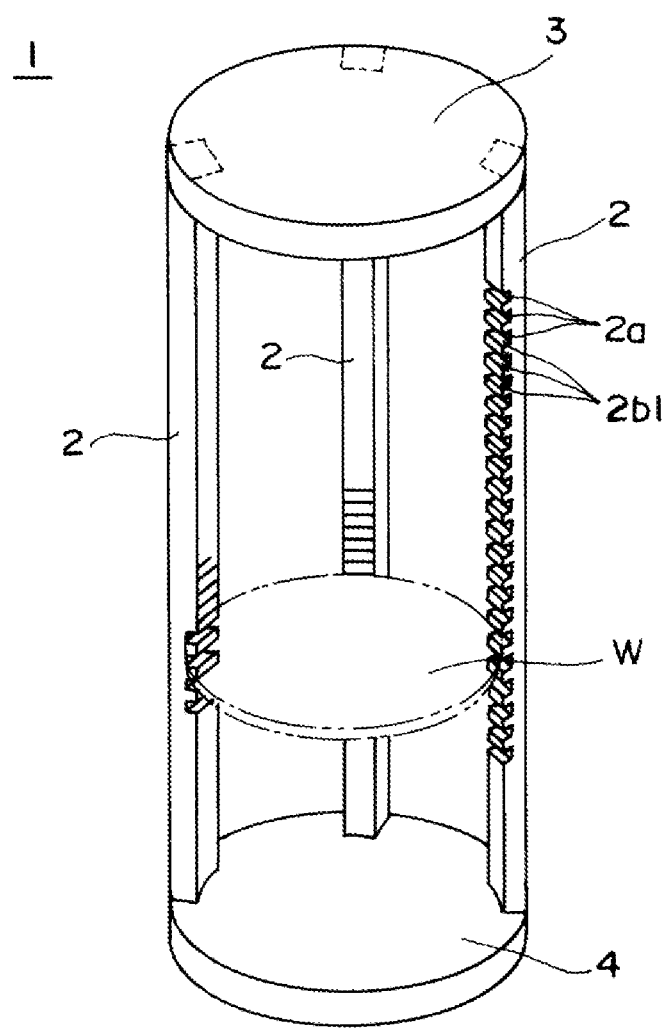
FIG. 5 is a perspective view illustrating a conventional wafer boat.
Figure 6:
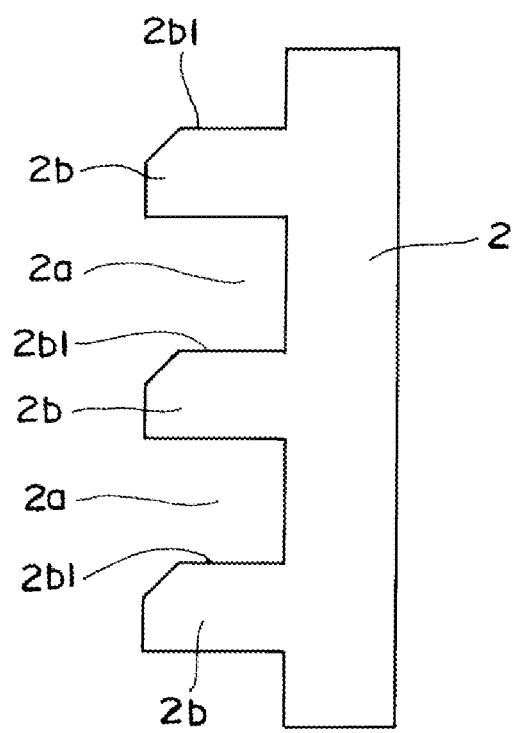
FIG. 6 is a magnified side view illustrating a part of the column of the conventional wafer boat.

Hereinafter, description will be made of an embodiment of a wafer boat and a manufacturing method for the same according to the present invention with reference to the accompanying drawings. The wafer boat according to the present invention is different from the conventional wafer boat described above with reference to FIG. 5 and FIG. 6 only in the structure of the shelf plate portion that supports the silicon wafer, and the detailed description on the same structure is therefore omitted.

Figure 1:
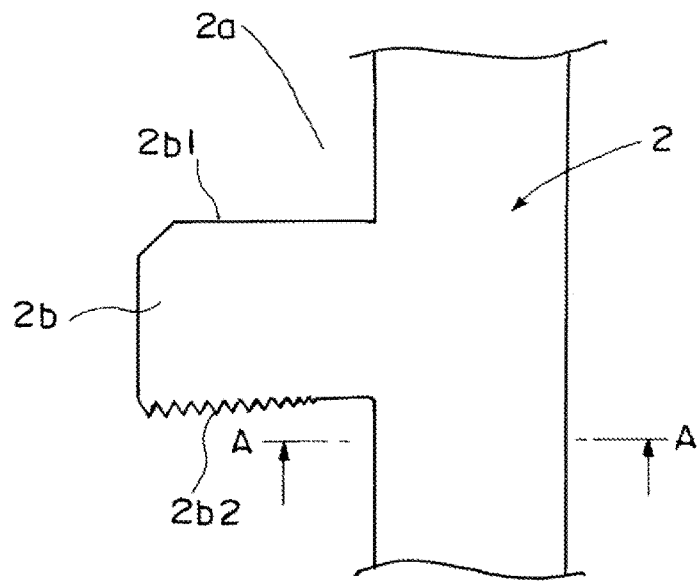
FIG. 1 is a magnified side view illustrating one of a plurality of columns included in a wafer boat according to the present invention.
Figure 2:
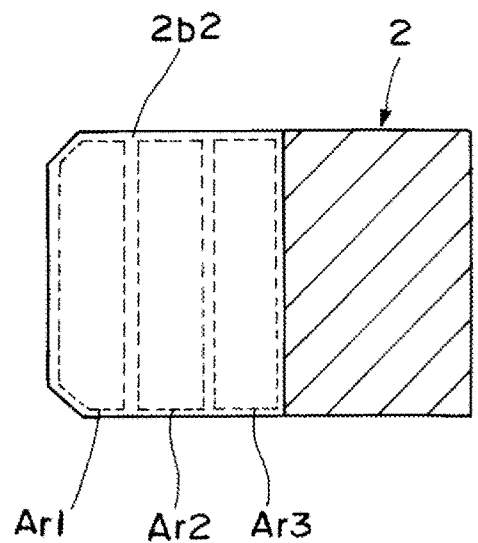
FIG. 2 is a sectional view from arrows A-A in FIG. 1, illustrating a lower surface side of a shelf plate portion.

FIG. 1 is a magnified side view illustrating one of a plurality of columns included in a wafer boat according to the present invention. FIG. 2 is a sectional view from arrows A-A in FIG. 1, illustrating a lower surface side of the shelf plate portion 2b.

As illustrated in FIG. 1 (and FIG. 5), the column 2 is formed to have a plurality of support grooves 2a at predetermined intervals on the inside along the longitudinal direction of the column 2. By the formation of the support grooves 2a, the plate-shaped shelf plate portions 2b are formed. The silicon wafer W is supported by at the outer peripheral portion and in contact with the supporting plane 2b1 of the shelf plate portion 2b provided for each of the plurality of columns 2 and held by the wafer boat.

Each column 2 has surfaces covered with the SiC coating film by CVD process and the SiC coating film on the upper surface (supporting surface 2b1) of the shelf plate portion 2b is in a smoothed state. With a smoothing process, the generation of the particles from the SiC coating film is suppressed when the wafer W is brought into contact with the supporting plane 2b1 of the shelf plate portion 2b.

On the other hand, a lower surface 2b2 of the shelf plate portion 2b is in the roughened state (preferably, with a surface roughness Ra in a range of 1.0 μm or more and 3.0 μm or less). In particular, this surface roughening process is performed so that the surface roughness increases from the rear side (column side) of the shelf plate portion 2b toward the front side thereof.

When the heat treatment is performed with holding the wafers W, this roughening process makes it easier for the deposit film to be deposited on the lower surface 2b2 of the shelf plate portion 2b (especially on the front side where peeling off of the deposit film easily occurs); as the deposit film thickness increases, the peeling off of the deposit film, which would generate the particles, can be largely suppressed.

It is desirable that the top plate 3 and the bottom plate 4, as with the column 2, are made of the SiC-based material, the SiC coating film is formed on the surface of the base material, and the surface roughness Ra thereof is in the range of 1.0 μm or more and 3.0 μm or less.

Figure 3A:
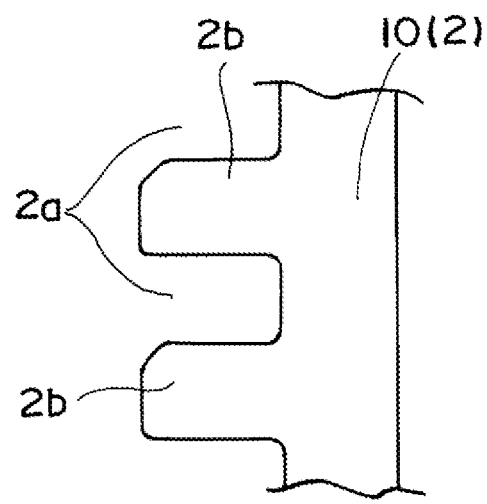
FIG. 3A is a sectional view schematically illustrating a manufacturing process for a wafer boat according to the present invention (forming method for column)

Next, a manufacturing method for the wafer boat according to the present invention will be described with reference to FIGS. 3A to 3D. FIGS. 3A to 3D are sectional views schematically illustrating a manufacturing method (forming method) for the column 2. For forming the column 2, firstly, a plurality of grooves is formed by using a rotary cutter in parallel to each other in a rod-like SiC-based material 10 along a longitudinal direction thereof. Thus, the column with a plurality of support grooves 2a as illustrated in FIG. 3A is formed. With the support grooves 2a, the plate-shaped shelf plate portions 2b projecting horizontally are formed and the upper surface of the shelf plate portion 2b serves as the supporting plane 2b1.

Figure 3B:
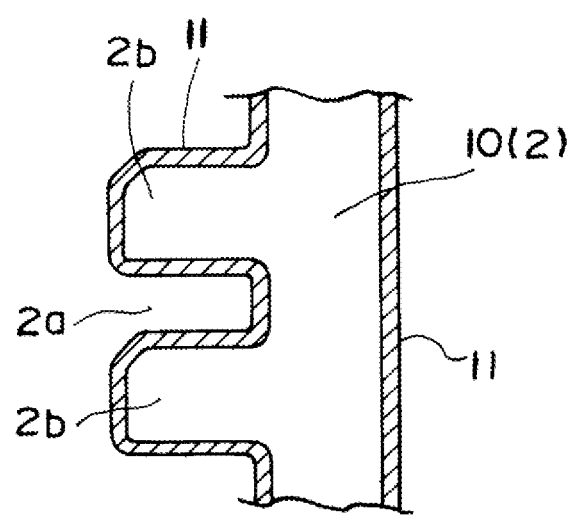
FIG. 3B is a sectional view schematically illustrating a manufacturing process for a wafer boat (forming method for column), which is subsequent to FIG. 3A.

Next, as illustrated in FIG. 3B, the SiC-based material 10 is processed by a chemical vapor growth method (CVD) at 1100° C. for 15 hours. By this CVD process, a SiC coating layer 11 is formed to have a predetermined film thickness (for example, 60 μm) on the surface of the base material.

Figure 3C:
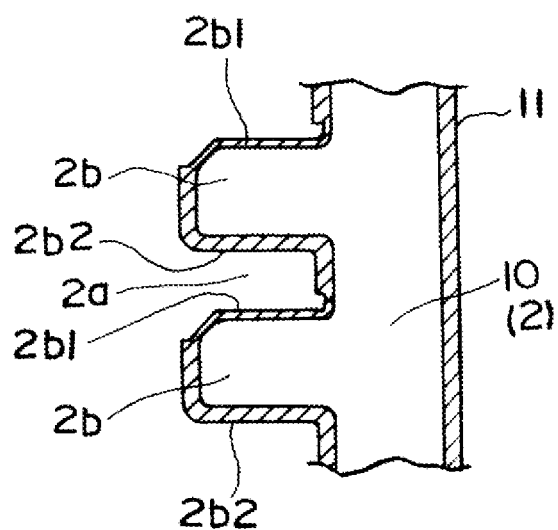
FIG. 3C is a sectional view schematically illustrating a manufacturing process for a wafer boat (forming method for column), which is subsequent to FIG. 3B.

Next, as illustrated in FIG. 3C, the supporting plane 2b1 of the shelf plate portion 2b with the surface provided with the SiC layer 11 is smoothed by a polishing process.

Figure 3D:
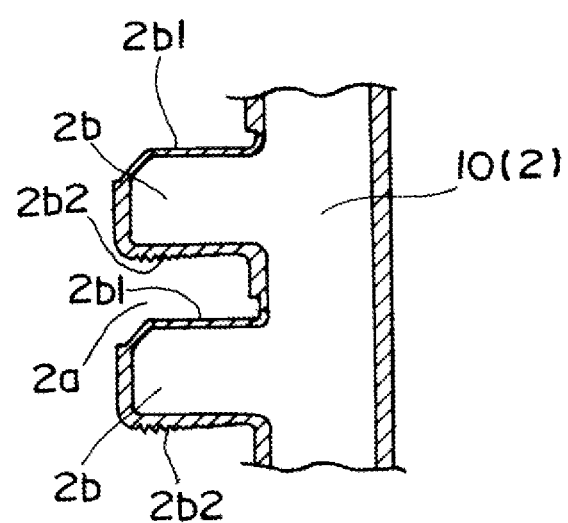
FIG. 3D is a sectional view schematically illustrating a manufacturing process for a wafer boat (forming method for column), which is subsequent to FIG. 3C.
Figure 4:
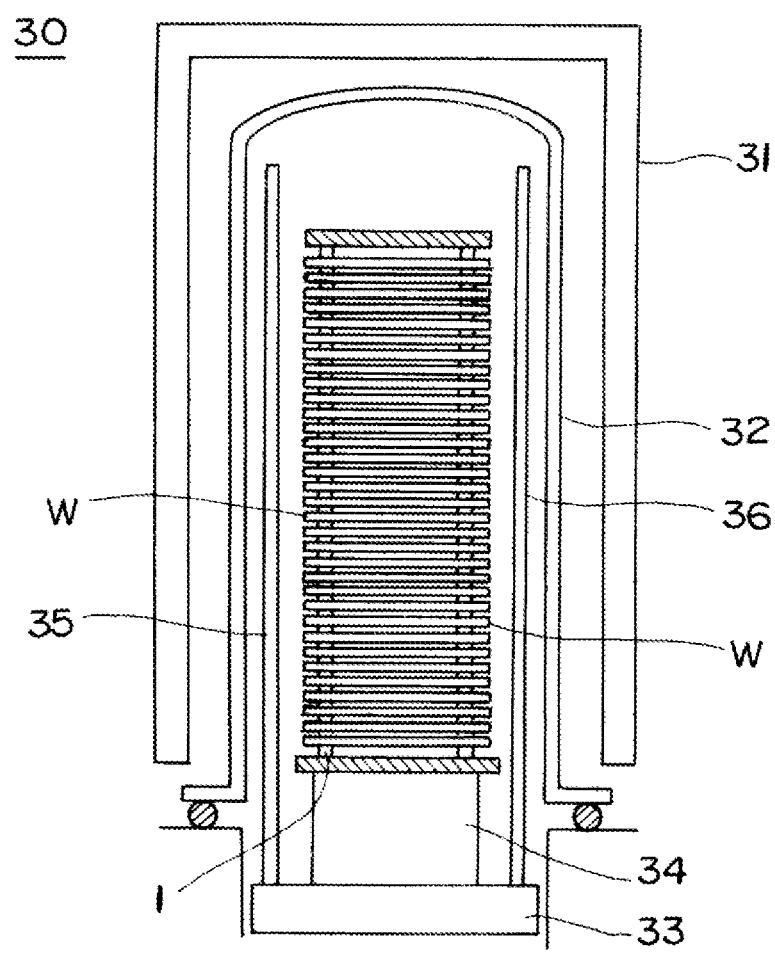
FIG. 4 is a sectional view illustrating a conventional vertical low-pressure CVD apparatus.

After the supporting plane 2b1 is polished, the lower surface 2b2 of the shelf plate portion 2b is roughened as illustrated in FIG. 3D. Specifically, silicon carbide powder with a medium size (D50) of approximately 100 μm is used to perform a sand blasting process to the lower surface 2b2.

The surface roughness Ra of the lower surface 2b2 is set in the range of 1.0 μm or more and 3.0 μm or less and is increased toward the front (end) of the shelf plate portion 2b. The surface roughness Ra increasing toward the front (end) of the shelf plate portion 2b is achieved by starting the sand blasting process from the inner surface side (groove side) of the column 2. That is to say, by performing the sand blasting process from the groove side of the column 2, more silicon carbide powder collides with the front (end) of the shelf plate portion 2b and less silicon carbide powder collides with the rear of the shelf plate portion 2b. Thus, the lower surface 2b2 of the shelf plate portion 2b is rougher toward the front side thereof.

The lower surface 2b2 of the shelf plate portion 2b of the SiC-based material before the CVD process may be subjected to the sand blasting process to have a surface roughness Ra in a range of 0.5 μm or more and 2.0 μm or less and then subjected to the CVD process to have a surface roughness Ra in the range of 1.0 μm or more and 3.0 μm or less.

The wafer boat and the manufacturing method for the same according to the present invention will be further described with reference to Examples. In Examples, the wafer boat described in the embodiment was manufactured and the performance of the obtained wafer boat was examined.

Example 1

In Example 1, for forming the column, a plurality of support grooves for wafer supporting is formed by a rotary cutter in the SiC based-material and a CVD process was performed at 1100° C. for 15 hours to form the SiC coating film with a thickness of 60 μm on the surface of the SiC-based material.

Next, the upper surface (supporting plane) of the shelf plate portion formed by the support groove was polished to be smooth.

In addition, the lower surface of the shelf plate portion was subjected to the sand blasting process (using silicon carbide powder D50 having a diameter of approximately 100 μm) so that the roughness of the lower surface increases toward the front thereof. Using this roughening process, roughness Ra (arithmetic average roughness) of the lower surface becomes 2.1 μm in an area Ar1 on the front side of the lower surface 2b2, 1.5 μm in an area Ar2 at the center, and 1.1 μm in an area Ar3 on the deepest side (column side), respectively, as illustrated in FIG. 2.

The obtained column was washed with acid and then washed with pure water and dried; thus, the column was completed. After a necessary number of columns were formed similarly, the top plate and the bottom plate were assembled to columns to finish the assembled vertical wafer boat.

In addition, 50 silicon wafers were set to the vertical wafer boat and heated in the furnace at 750° C. for an hour.

In Example 1, the number of particles (pieces/wafer) attached on the front and rear surfaces of the heated silicon wafer was measured.

Example 2

In Example 2, using the roughening process, roughness Ra (arithmetic average roughness) of the lower surface becomes 3.0 μm in an area Ar1 on the front side of the lower surface 2b2, 2.0 μm in an area Ar2 at the center, and 1.0 μm in an area Ar3 on the deepest side (column side), respectively, as illustrated in FIG. 2.

The other conditions are the same as those of Example 1.

With the manufactured vertical wafer boat, wafers were heated under the same condition as that of Example 1 and the number of particles (pieces/wafer) on the front and rear surfaces of the wafer was measured.

Example 3

In Example 3, using the roughening process, roughness Ra (arithmetic average roughness) of the lower surface becomes 2.1 μm in an area Ar1 on the front side of the lower surface 2b2, 1.1 μm in an area Ar2 at the center, and 0.5 μm in an area Ar3 on the deepest side (column side), respectively, as illustrated in FIG. 2. The other conditions are the same as those of Example 1.

With the manufactured vertical wafer boat, the wafers were heated under the same condition as that of Example 1 and the number of particles (pieces/wafer) on the front and rear surfaces of the wafer was measured.

Example 4

In Example 4, using the roughening process, roughness Ra (arithmetic average roughness) of the lower surface becomes 4.0 μm in an area Ar1 on the front side of the lower surface 2b2, 3.1 μm in an area Ar2 at the center, and 2.2 μm in an area Ar3 on the deepest side (column side), respectively, as illustrated in FIG. 2.

The other conditions are the same as those of Example 1.

With the manufactured vertical wafer boat, the wafers were heated under the same condition as that of Example 1 and the number of particles (pieces/wafer) on the front and rear surfaces of the wafer was measured.

Comparative Example 1

In Comparative Example 1, for forming the column, a plurality of support grooves for supporting wafers was formed by a rotary cutter in the SiC-based material and a CVD process was performed at 1100° C. for 15 hours to form the SiC coating film with a thickness of 60 μm on the surface of the SiC-based material.

Next, the upper surface (supporting plane) of the shelf plate portion formed by the support groove was polished to be smooth.

The obtained column was washed with acid and then washed with pure water and dried; thus, the column was completed. After a necessary number of columns were formed similarly, the top plate and the bottom plate were assembled thereto to manufacture the assembled vertical wafer boat.

With the manufactured vertical wafer boat, the wafers were heated under the same condition as that of Example 1 and the number of particles (pieces/wafer) on the front and rear surfaces of the wafer was measured.

Table 1 shows the results from Examples 1 to 4 and Comparative Example 1.

TABLE 1

|  | Surface roughness of lower surface of shelf plate portion | Thickness of deposited film on lower surface of shelf plate portion | Number of particles with diameter less than 0.5 μm | Results |
| --- | --- | --- | --- | --- |
| Example 1 | 1.1 to 2.1 μm | 6.3 μm | 3 | good |
| Example 2 | 1.0 to 3.0 μm | 6.9 μm | 2 | good |
| Example 3 | 0.5 to 2.1 μm | 3.2 μm | 6 | fair |
| Example 4 | 2.2 to 4.0 μm | 4.5 μm | 5 | fair |
| Comparative Example 1 | — | 2.9 μm | 13 | poor |

As shown in Table 1, it has been confirmed that, by setting the surface roughness Ra of the lower surface of the shelf plate portion in the range of 1.0 μm or more and 3.0 μm or less, the amount of depositions on the lower surface of the shelf plate portion of the wafer boat after the heat treatment increases by 50% or more and the number of particles attached to the wafer decreases by 30% or more because the peeling off was suppressed.

What is claimed is:

1. A vertical wafer boat comprising a plurality of columns which is made of SiC-based material with a surface thereof provided with a SiC coating film and includes shelf plate portions for supporting wafers thereon, and a top plate and a bottom plate for fixing upper and lower ends of the columns, wherein
the shelf plate portion has an upper surface provided with a supporting plane which is in contact with an outer peripheral portion of the wafer, and
the shelf plate portion has a lower surface whose surface roughness Ra increases from a rear side toward a front side of the shelf plate portion.

2. The vertical wafer boat according to claim 1, wherein the surface roughness Ra of the lower surface of the shelf plate portion is in a range of 1.0 µm or more to 3.0 µm or less.

3. The vertical wafer boat according to claim 2, wherein the top plate and the bottom plate are made of SiC-based material and a SiC coating film is formed on a surface thereof.

4. The vertical wafer boat according to claim 1, wherein the top plate and the bottom plate are made of SiC-based material and a SiC coating film is formed on a surface thereof.

5. A manufacturing method of a vertical wafer boat including a plurality of columns, which is formed of SiC-based material with a surface thereof provided with a SiC coating film and include shelf plate portions for supporting wafers placed thereon, and a top plate and a bottom plate for fixing upper and lower ends of the columns, the method comprising
a step of performing a process such that a surface roughness Ra of a lower surface of the shelf plate portion increases toward a front side of the shelf plate portion from a rear side.

6. The manufacturing method of a vertical wafer boat according to claim 5, wherein in the step of performing a roughening process to the lower surface of the shelf plate portion, the roughening process is performed so that the surface roughness Ra is in the range from 1.0 □m or more to 3.0 □m or less.

7. The manufacturing method of a vertical wafer boat according to claim 6, further comprising a step of performing a smoothing process to an upper surface of the shelf plate portion.

8. The manufacturing method of a vertical wafer boat according to claim 5, further comprising a step of performing a smoothing process to an upper surface of the shelf plate portion.

* * * * *